(12) United States Patent
Ma

(10) Patent No.: US 7,841,884 B2
(45) Date of Patent: Nov. 30, 2010

(54) LAND GRID ARRAY CONNECTOR

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 54 days.

(21) Appl. No.: 12/288,731

(22) Filed: Oct. 23, 2008

(65) Prior Publication Data

US 2009/0104794 A1 Apr. 23, 2009

(30) Foreign Application Priority Data

Oct. 23, 2007 (CN) .................... 2007 2 0042409 U

(51) Int. Cl.
*H01R 13/62* (2006.01)
(52) U.S. Cl. .................... 439/331; 439/73; 439/342
(58) Field of Classification Search .................... 439/73, 439/331, 66, 342, 525, 526
See application file for complete search history.

(56) References Cited

U.S. PATENT DOCUMENTS

| | | | |
|---|---|---|---|
| 6,219,241 B1 * | 4/2001 | Jones | 361/704 |
| 6,361,336 B1 * | 3/2002 | Zhao et al. | 439/157 |
| 6,659,806 B2 * | 12/2003 | Shi et al. | 439/676 |
| 6,877,990 B2 | 4/2005 | Liao et al. | |
| 7,025,603 B2 * | 4/2006 | Ma | 439/73 |
| 7,059,885 B2 | 6/2006 | Szu et al. | |
| 7,435,124 B2 * | 10/2008 | Ma et al. | 439/331 |
| 7,588,442 B2 * | 9/2009 | Ma | 439/73 |
| 2006/0110967 A1 * | 5/2006 | Ma | 439/331 |
| 2006/0121765 A1 * | 6/2006 | Ma | 439/331 |
| 2006/0141840 A1 * | 6/2006 | Ma | 439/331 |

\* cited by examiner

*Primary Examiner*—Renee Luebke
*Assistant Examiner*—Vanessa Girardi
(74) *Attorney, Agent, or Firm*—Andrew C. Cheng; Wei Te Chung; Ming-Chieh Chang

(57) ABSTRACT

An LGA connector, for interconnecting an IC package with a printed circuit board, includes an insulative housing having a number of electrical terminals received therein, a metal stiffener mounted to the insulative housing, a cover and a lever pivotally engaged to two opposite ends of the stiffener, respectively. The insulative housing defines an opening for receiving the IC package and two walls extending upwardly thereof, and each wall disposes a first cutout. The stiffener surrounding the insulative housing defines two side walls adjacent and parallel to the walls of the insulative housing. Each side wall disposes a second cutout corresponding to the first cutout so as to so as to remove the IC package easily.

16 Claims, 3 Drawing Sheets

US 7,841,884 B2

LAND GRID ARRAY CONNECTOR

BACKGROUND OF THE INVENTION

1. Field of the Invention

The present invention relates to an electrical connector for electrically connecting an electronic package such as an integrated circuit (IC) package with a circuit substrate such as a printed circuit board (PCB), and particularly to a land grid array connector having a stiffener with cutouts to remove the IC package easily.

2. Description of the Related Art

Land grid array (LGA) connector for electrically connecting a land grid package (LGP) with a printed circuit board (PCB) is widely used in the field of electrical connectors. The conventional LGA connector, such as disclosed in U.S. Pat. Nos. 6,877,990 and 7,059,885, issued to Liao on Apr. 12, 2005, and Szu on Jun. 13, 2006, respectively, typically comprises an insulative housing, a stiffener mounted around the insulative housing, a cover pivotally engaged with one end of the stiffener, and a lever engaged with the other end of the stiffener for fastening the cover onto the insulative housing. The LGP is sandwiched between the cover and the insulative housing. The insulative housing usually defines an opening adapted for receiving the LGP and a cutout in two transversal sides thereof opposite to the ends of the stiffener, respectively, for removing the LGP more easily.

Now referring to FIG. 1, FIG. 1 discloses a related LGA connector which is our new confidential design and not be published is illustrated. The LGA connector 100' comprises an insulative housing 1', a stiffener 2' mounted around the insulative housing 1', a metal cover 3' pivotally engaged on one end of the stiffener 2', and a lever 4' engaged on the other end of the stiffener 2' for fastening the cover 3' onto the insulative housing 1'. The stiffener 2' includes a bottom plate 21' and two lengthwise sidewalls 22' extending upwardly from the bottom plate 21'. The insulative housing 1' is mounted on the bottom plate 21' of the stiffener 2' and defines an opening 10' for receiving an LGP (not shown) and two opposite lengthwise walls 11' substantially parallel to the two sidewalls 22' of the stiffener 2'. As the insulative housing 1' has a bigger length dimension, each wall 11' disposes a cutout 12' in center thereof for removing the LGP. The cover 3' includes a main plate 31' and two side plates 32', 33' extending downwardly from two sides of the main plate 31'. The lever 4' comprises a pivotal arm 41' and an operational arm 42' substantially perpendicular to the pivotal arm 41'.

In use, the cover 3' is first rotated to a vertical open position, and the LGP (not shown) is seated onto the opening 10' of the insulative housing 1'. Then the cover 3' is rotated to a horizontal closed position and locked by the lever 4'. At last, the LGP (not shown) is sandwiched between the insulative housing 1' and the cover 3'.

However, in the LGA connector 100' above-mentioned, the wall 11' of the insulative housing 1' is closer to the sidewalls 22' of the stiffener 2' in order to save space and material. In this case, there is not enough space between the wall 11' and the sidewall 22' for removing the LGP (not shown) by virtue of the cutout 12' of the wall 11'.

In view of the above, a new LGA connector which overcomes the above-mentioned disadvantages is desired.

SUMMARY OF THE INVENTION

Accordingly, an object of the present invention is to provide an LGA connector that can remove the LGP easily when the LGP is being sandwiched in the LGA connector.

To achieve the above-mentioned object, an LGA connector in accordance with the present invention comprises an insulative housing, a plurality of terminals disposed in the insulative housing, a stiffener surrounded the insulative housing, a cover and a lever pivotally mounted two opposite ends of the stiffener, respectively. The insulative housing includes a base portion and two opposite peripheral walls extending upwardly from the base portion, and each wall defines a first cutout for removing the IC package easily. The stiffener comprises a bottom plate and two sidewalls extending upwardly from the bottom plate and adjacent to the walls of the insulative housing, and each sidewall defines a second cutout corresponding to the cutout of the wall of the insulative housing.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
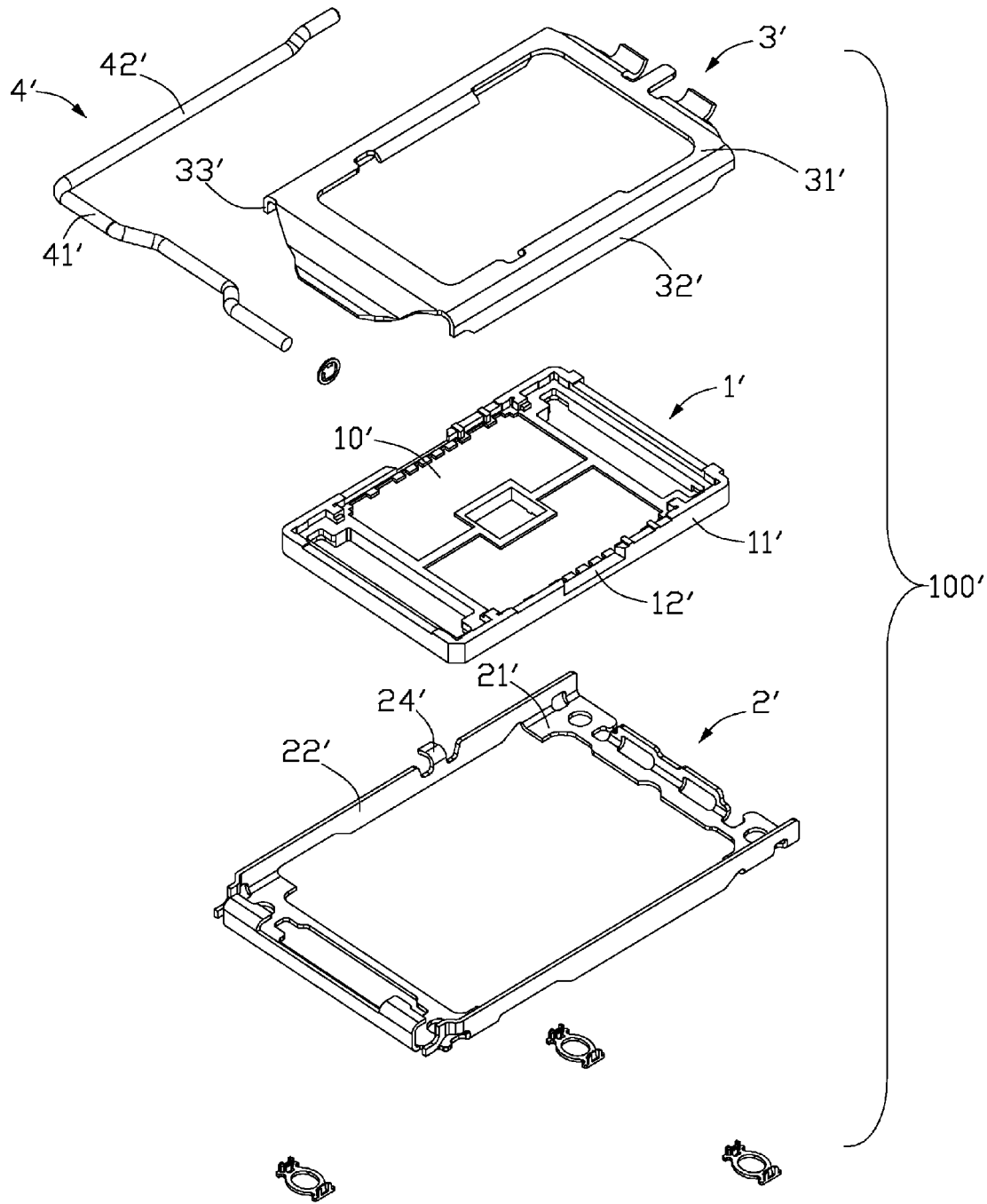
FIG. 1 is an exploded, perspective view of a related LGA connector.
Figure 2:
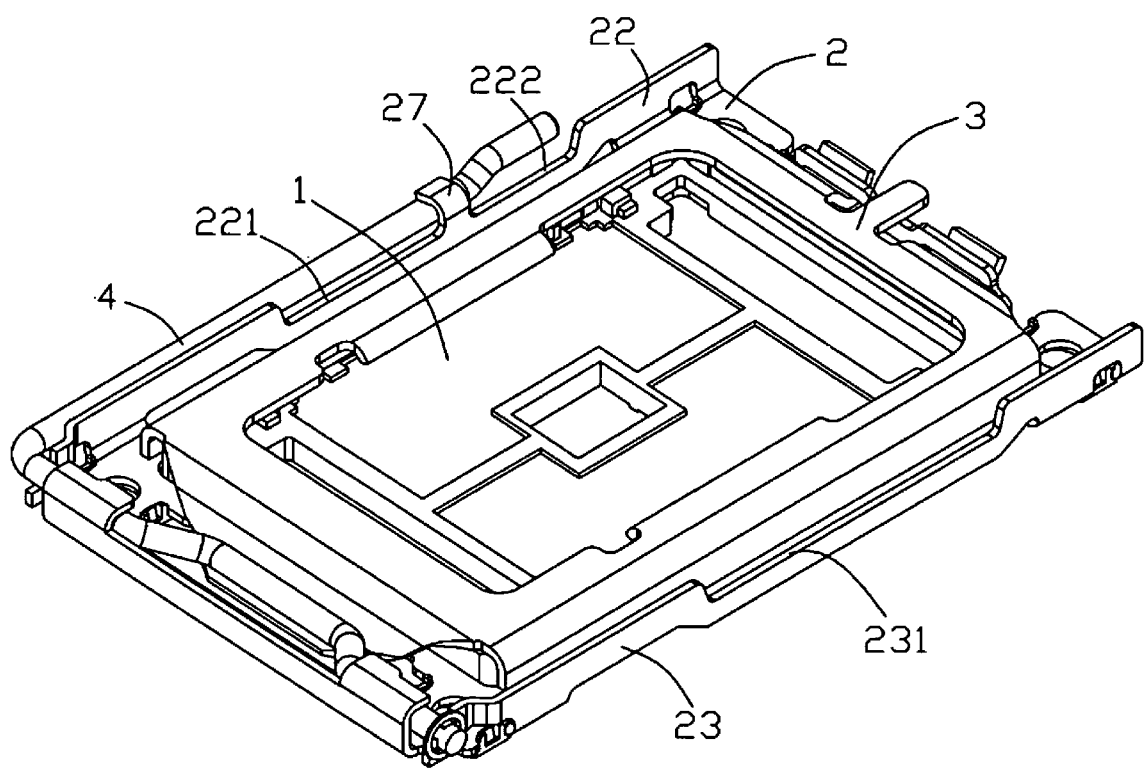
FIG. 2 is an assembled, perspective view of an LGA connector in accordance with the embodiment of the present invention.

Referring to FIG. 2, an LGA connector 100 in accordance with the preferred embodiment of the present invention comprises an insulative housing 1, a plurality of terminals (not shown), a stiffener 2 surrounding the insulative housing 1, a metal cover 3 pivotally engaged on a first end of the stiffener 2, and a lever 4 pivotally engaged on a second end opposite to the first end of the stiffener 2.

Figure 3:
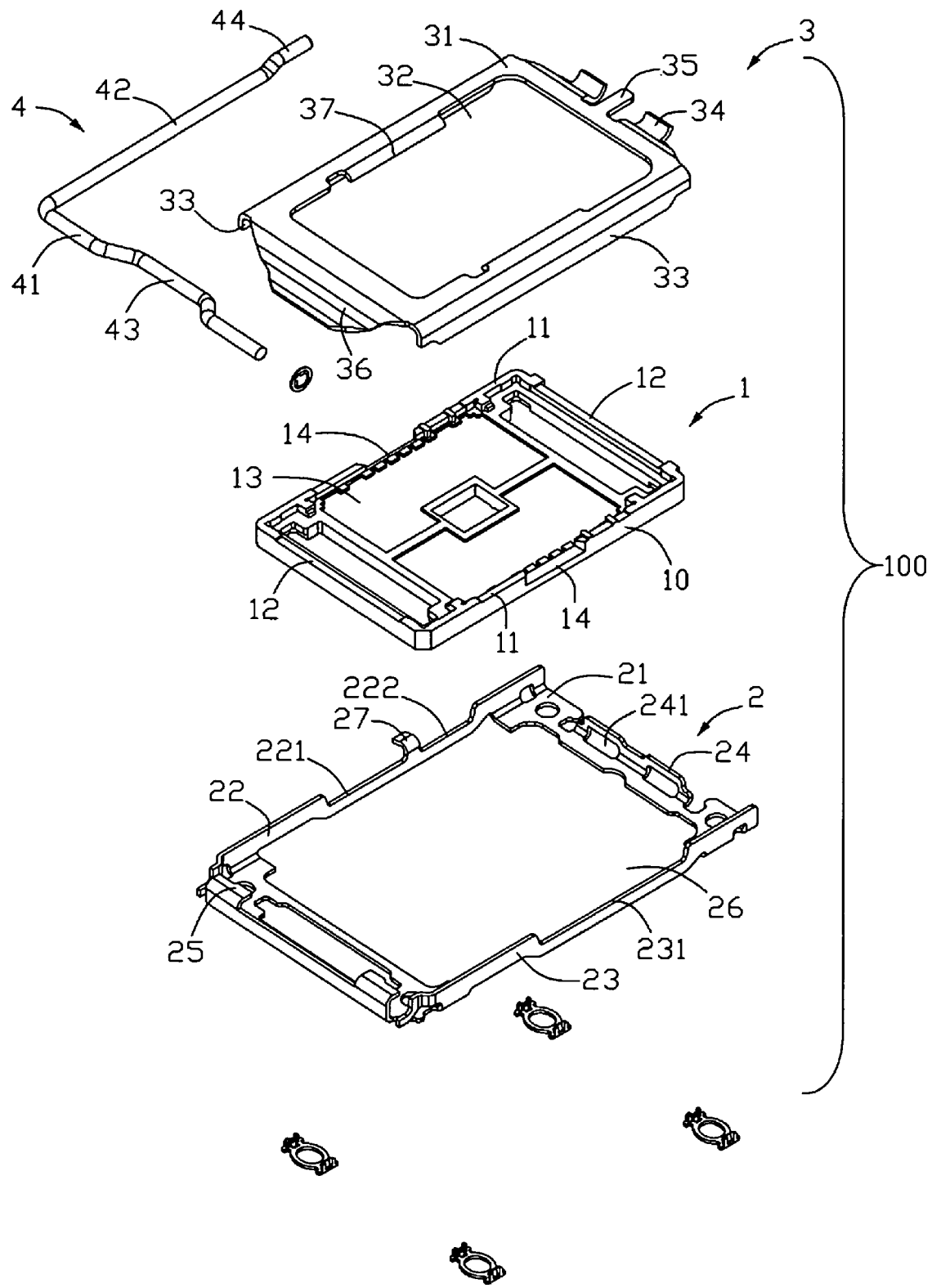
FIG. 3 is an exploded, perspective view of the LGA connector shown in FIG. 2.

Referring to FIG. 3, the insulative housing 1 has a substantially rectangular configuration. The insulative housing 1 includes a base portion 10 and two pairs of opposite walls 11, 12 extending upwardly from the base portion 10 for forming an opening 13 to receive an LGP (not shown). The base portion 10 defines a plurality of passageways (not shown) through there adapted for receiving the plurality of terminals. The pair of longitudinal walls 11 each define a first cutout 14 in centre thereof. The first cutout 14 runs through a top edge of the longitudinal wall 11.

The stiffener 2 comprises a bottom plate 21, two opposite sidewalls 22, 23 extending upwardly from the bottom plate 21, a first and second ends 24, 25, and a window 26 formed therebetween for receiving the insulative housing 1. A hooking portion 27 extends outwardly from a top end of the sidewall 22 for retaining the lever 4. The two sidewalls 22, 23 are adjacent to the longitudinal walls 11 of the insulative housing 1, respectively, and each defines a second cutout 221, 231 corresponding to the first cutouts 14 of the longitudinal walls 11. The second cutouts 221, 231 run through top edges of the sidewalls 22, 23, respectively. The first end 24 defines two locking holes 241 for retaining the cover 3.

The cover 3 is pivotally engaged with the first end 24 of the stiffener 2 and also has a substantially rectangular configuration and comprises a main body 31 having an access 32 and two opposite side plates 33 extending downwardly from two outside edges of the main body 31, respectively. A pair of latches 34 and an anti-rotation bar 35 located therebetween extend from one end of the main body 31 for engaging with the locking holes 241 of the stiffener 2, and a tongue portion 36 extends from the other end of the main body 31 for being pressed by the lever 4. A pair of pressing portions 37 bends toward the insulative housing 1 inner side of the main body 31 for pressing the LGP (not shown).

The lever 4 is pivotally engaged with the second end 25 of the stiffener 2 and comprises a pivotal arm 41 and an operational arm 42 substantially perpendicular to the pivotal arm 41. The pivotal arm 41 defines a middle curved portion 43 for pressing on the tongue portion 36 of the cover 3. The operational arm 42 is locked with the hooking portion 27 of the stiffener 2, therefore fastening the LPG (not shown) between the insulative housing 1 and the cover 3. A handle 44 extends upwardly and forwardly from a distal end of the operational arm 42. The handle 44 parallels to the operational arm 42 and has a same distance to sidewall 22 with the operational arm 42. A third cutout 222 is disposed in the sidewall 22 of the insulative housing 1 so as to facilitate the operation of the handle 44. The third cutout 222 runs through a top edge of the sidewall 22.

When the connector 100 is in use, the LGP (not shown) is disposed into the opening 13 of the insulative housing 1. To remove the LGP (not shown), an operator can first press the lever 4 via the handle 44 to unlock the lever 4 from the hooking portion 27 of the stiffener 2, then rotate the lever 4 upwardly to a open position, and then rotate the cover 3 to a vertical open position, and at last remove the LGA (not shown) easily by virtue of the first cutout 14 of the insulative housing 1 and the second cutout 221, 231 of the stiffener 2. Accordingly, the interference between the sidewall 22 or 23 with the longitudinal wall 11 is avoided because of the second cutout 221, 231. In addition, the third cutout 222 of the stiffener 2 makes the operation of the handle 44 of the lever 4 more easily.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array connector for interconnecting an electronic package and a circuit substrate, comprising:
   an insulative housing receiving a plurality of terminals, including a base portion and two opposite peripheral walls extending upwardly from the base portion, and each wall defining a first cutout for removing the electronic package easily;
   a stiffener surrounding the insulative housing and comprising a bottom plate, two sidewalls extending upwardly from the bottom plate and adjacent to the walls of the insulative housing and two opposite ends extending between said two sidewalls, and each sidewall defining a second cutout corresponding to the first cutout of the insulative housing; and
   a cover pivotally mounted to one of said opposite ends of the stiffener.

2. The land grid array connector as claimed in claim 1, wherein the insulative housing and the stiffener each define a pair of longitudinal sides and a pair of transverse sides, said first and second cutouts are disposed in the longitudinal sides.

3. The land grid array connector as claimed in claim 1, further comprising a lever pivotally mounted to the other end of the stiffener.

4. The land grid array connector as claimed in claim 3, wherein the lever includes a pivotal arm and an operational arm extending perpendicularly from one end of the pivotal arm.

5. The land grid array connector as claimed in claim 4, wherein a handle extends upwardly and forwardly from a distal end of the operational arm, and the handle parallels to the operational arm, the distance between the handle and one of the sidewalls is same as the distance between the operational arm and said one of the sidewalls.

6. The land grid array connector as claimed in claim 5, wherein the stiffener has a hooking portion extending from the first sidewall of the stiffener for locking the operational arm of the lever.

7. The land grid array connector as claimed in claim 6, wherein the first sidewall disposes a third cutout corresponding to the handle of the lever so as to facilitate the operation of the handle.

8. The land grid array connector as claimed in claim 7, wherein the third cutout runs through a top edge of the first sidewall.

9. A fastening device, for fixing an electronic package to an electrical connector, comprising:
   a stiffener comprising a bottom plate, two longitudinal sidewalls extending upwardly from the bottom plate and two ends extending between said two longitudinal sidewalls, each longitudinal sidewall defining a cutout in center thereof and running through a top edge of the sidewalls;
   a cover pivotally mounted to one end of the stiffener; and
   a lever pivotally mounted to the other end of the stiffener; wherein
   the lever includes a pivotal arm and an operational arm extending perpendicularly from one end of the pivotal arm; wherein
   a handle extends upwardly and forwardly from a distal end of the operational arm, and the handle and the operational arm are located in a vertical plane paralleled to one of the sidewalls.

10. The fastening device as claimed in claim 9, wherein the stiffener has a hooking portion extending from the first sidewall of the stiffener for locking the operational arm of the lever.

11. The fastening device as claimed in claim 10, wherein the first sidewall has another cutout corresponding to the handle of the lever so as to facilitate the operation of the handle.

12. An electrical connector comprising:
   a rectangular metallic stiffener defining a bottom plate with a rectangular configuration having thereof two longitudinal sides extending along a longitudinal direction and two transverse ends extending along a transverse direction perpendicular to said longitudinal direction, said stiffener including two opposite side plates extending upwardly from two opposite edges of the two longitudinal sides of the bottom plate;
   a hook unitarily formed on one of said side plate;
   an insulative housing located between said opposite side plates in said transverse direction for receiving an electronic package;
   a load plate pivotally mounted to one end of the stiffener; and
   a lever pivotally mounted to an opposite end of the stiffener to lock the load plate in position, and defining an operation arm moveable in a vertical plane closer to one of said opposite side plates; wherein said one of said opposite side plates defines a downward cutout located around said hook and configured to be long enough in said longitudinal direction to allow a finger to enter in said transverse direction for not only easy operation of said operation arm but also less interference between the load plate and the stiffener.

13. The electrical connector as claimed in claim 12, wherein said cutout is located around a middle area of the one of the opposite side walls and communicates with another cutout formed in housing to cooperate with each other for allowing the finger to enter for loading/unloading said electronic package with regard to the housing.

14. The electrical connector as claimed in claim 12, wherein the longitudinal side is longer than the transverse side.

15. The electrical connector as claimed in claim 12, wherein a handle is located a distal end of the operational arm, and said cutout corresponds to the handle in the transverse direction.

16. The electrical connector as claimed in claim 15, wherein a length of said cutout is greater than that of the handle.

* * * * *